(12) United States Patent
Miks et al.

(10) Patent No.: US 7,019,387 B1
(45) Date of Patent: Mar. 28, 2006

(54) LEAD-FRAME CONNECTOR AND CIRCUIT MODULE ASSEMBLY

(75) Inventors: Jeffrey Alan Miks, Chandler, AZ (US); Kenneth Kaskoun, Phoenix, AZ (US); John Miranda, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 407 days.

(21) Appl. No.: 10/076,896

(22) Filed: Feb. 14, 2002

(51) Int. Cl.
*H01L 23/45* (2006.01)

(52) U.S. Cl. .................................................... 257/666
(58) Field of Classification Search ................ 257/666, 257/667, 668, 669, 670, 672, 676, 678, 679, 257/692, 694, 697, 707, 723, 724, 735, 787, 257/788; 438/123, 124, 127, 110, 109, 107, 438/112; 361/760, 761, 791, 785, 789, 668
See application file for complete search history.

(56) References Cited

U.S. PATENT DOCUMENTS

| | | | |
|---|---|---|---|
| 4,532,419 A | | 7/1985 | Takeda |
| 4,682,833 A | * | 7/1987 | Ferchau et al. ............. 439/377 |
| 4,696,525 A | * | 9/1987 | Coller et al. ................... 439/69 |
| 4,807,088 A | * | 2/1989 | Wistling ...................... 361/818 |
| 4,886,463 A | * | 12/1989 | Scott et al. ..................... 439/89 |
| 4,905,124 A | | 2/1990 | Banjo et al. |
| 4,974,120 A | | 11/1990 | Kodai et al. |
| 5,530,622 A | * | 6/1996 | Takiar et al. ................ 361/737 |
| 5,574,309 A | | 11/1996 | Papapietro et al. |
| 5,641,307 A | * | 6/1997 | Gerrans ....................... 439/606 |
| 5,718,038 A | * | 2/1998 | Takiar et al. .................. 29/842 |
| 5,742,479 A | | 4/1998 | Asakura |
| 5,780,928 A | * | 7/1998 | Rostoker et al. ............ 257/713 |
| 5,784,259 A | | 7/1998 | Asakura |
| 5,822,190 A | | 10/1998 | Iwasaki |
| 5,894,167 A | * | 4/1999 | Moden et al. ............... 257/679 |
| 5,895,222 A | * | 4/1999 | Moden et al. .................. 438/4 |
| 6,040,622 A | | 3/2000 | Wallace |
| D445,096 S | | 7/2001 | Wallace |
| D446,525 S | | 8/2001 | Okamoto et al. |
| 6,442,027 B1 | * | 8/2002 | Sanada et al. ............... 361/704 |
| 6,444,501 B1 | * | 9/2002 | Bolken ........................ 438/127 |
| 6,527,562 B1 | * | 3/2003 | Tanaka et al. ................. 439/65 |
| 6,593,662 B1 | * | 7/2003 | Pu et al. ...................... 257/777 |
| 6,603,196 B1 | * | 8/2003 | Lee et al. .................... 257/676 |

FOREIGN PATENT DOCUMENTS

| | | |
|---|---|---|
| JP | 10-12646 | 1/1989 |
| JP | 3-112688 | 5/1991 |
| JP | 07017175 A | 1/1995 |
| JP | 08190615 A | 7/1996 |
| JP | 10-334205 | 12/1998 |
| JP | 11-45959 | 2/1999 |

* cited by examiner

*Primary Examiner*—Douglas W Owens
(74) *Attorney, Agent, or Firm*—Weiss, Moy & Harris, P.C.

(57) ABSTRACT

A lead-frame connector and circuit module assembly allows fabrication of a pin-connector type circuit module without a circuit board substrate and discrete connector. One or more integrated circuit dies are attached to a metal lead-frame assembly and the die interconnects are wire-bonded to interconnect points on the lead-frame assembly. Connector pins formed on an extension of the lead-frame assembly provide an electrical interface to a mating connector without requiring a separate connector mounted on a substrate. An extension of the lead-frame assembly out of the circuit interconnect plane provides a multi-row pin connector in applications where a multi-row connector is needed.

22 Claims, 3 Drawing Sheets

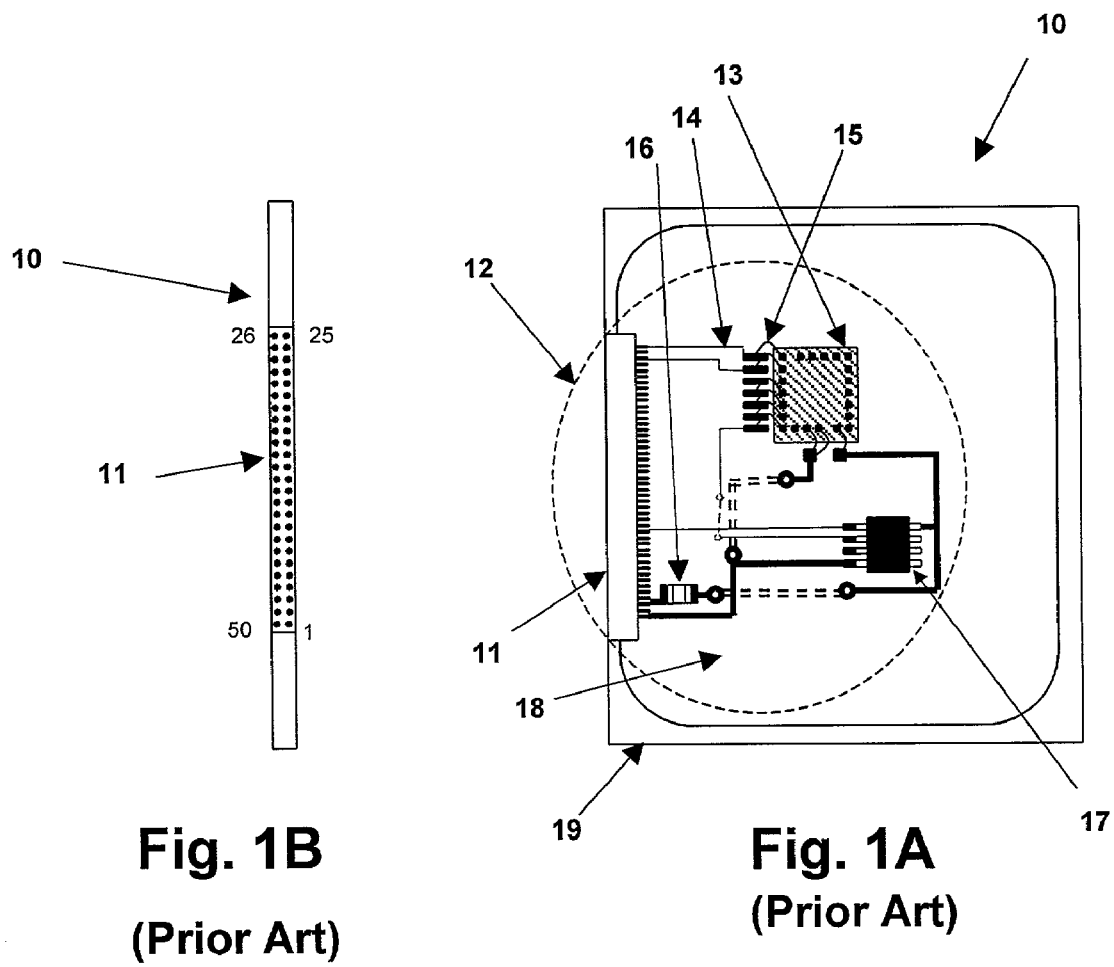
Fig. 1B
(Prior Art)
Fig. 1A
(Prior Art)
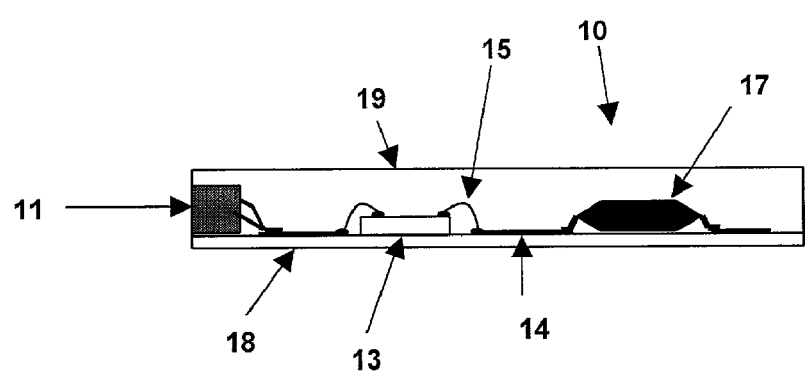
Fig. 1C
(Prior Art)

LEAD-FRAME CONNECTOR AND CIRCUIT MODULE ASSEMBLY

CROSS REFERENCE TO RELATED APPLICATION

This application relates to a previously filed U.S. patent application entitled "LEAD-FRAME METHOD AND ASSEMBLY FOR INTERCONNECTING CIRCUITS WITHIN A CIRCUIT MODULE" Ser. No. 09/956,190 filed Sep. 19, 2001, the specification of which is herein incorporated by reference.

FIELD OF THE INVENTION

The present invention relates generally to lead-frame assemblies for mounting integrated circuit dies, and more specifically, to a lead-frame assembly including connector pins and a method for fabricating a lead-frame assembly with connector pins.

BACKGROUND OF THE INVENTION

Circuit modules or cards are increasing in use to provide storage and other electronic functions for devices such as digital cameras, personal computing devices and personal digital assistants (PDAs). New uses for circuit modules include multimedia cards and secure digital cards.

Typically, circuit modules contain multiple integrated circuit devices or "dies". The dies are interconnected using a circuit board substrate, which adds to the weight, thickness and complexity of the module. Circuit modules also have electrical contacts for providing an external interface to the insertion point or socket. Some circuit module standards use contact pads on the bottom side of the substrate, and the above-incorporated patent application teaches a method and assembly wherein a substrate is not required and the contact pads are replaced with lead-frame contacts. As described in the above-incorporated patent, it is desirable for a number of reasons to produce a circuit module without a substrate, and the lead-frame embodiments taught therein provide a circuit module without a substrate and having a contact pad interface formed within the lead-frame carrier.

However, some circuit module standards such as Compact Flash (CF) require a pin connector located on a side of the circuit module, and in some cases the pin connector has multiple rows. (CF cards require a dual-row female 50-pin connector.) A typical CF circuit module (and other pin connector modules) includes a pin connector mounted on a substrate used to provide an electrical interface to external devices. The substrate is required to mount and electrically connect the pin connector to one or more semiconductor dies incorporated within the circuit module. Further, pin connectors are typically expensive items that form a significant portion of the manufacturing cost of a circuit module.

Therefore, it would be desirable to provide a method and assembly for including a pin connector within circuit modules without requiring a substrate. It would further be desirable to provide a multi-row pin connector within a lead-frame assembly. It would also be desirable to provide a pin connector within a circuit module assembly without requiring a discrete connector component.

SUMMARY OF THE INVENTION

A lead-frame connector and circuit module assembly provides a pin connector type circuit module without a circuit board substrate or discrete pin connector. A lead-frame assembly is connected to one or more dies and external pin contacts are formed by connector pins integral to an extension of the lead-frame assembly. A multiple row pin connector may be implemented by forming some of the pins out of the plane of the lead-frame assembly die mounting level. A novel female connector pin design provides female connector contacts using pins that are offset within the pin housing and are supported by the housing to eliminate any need for hardening of the connector pins.

In another embodiment of the invention, a substrate is included to provide mounting and interconnection of the semiconductor dies, but a lead-frame with formed connector pins is used to implement the connector and the lead-frame is then electrically connected to the substrate.

The present invention is best understood by reference to the following detailed description when read in conjunction with the accompanying drawings.

BRIEF DESCRIPTION OF THE DRAWINGS

FIG. 1A is a pictorial diagram depicting a top view, FIG. 1B is a pictorial diagram depicting a side view and FIG. 1C is a pictorial diagram depicting a cross section of a prior art circuit module;

Common reference numerals are used throughout the drawings and detailed description to indicate like elements.

DETAILED DESCRIPTION

Figure 2B:
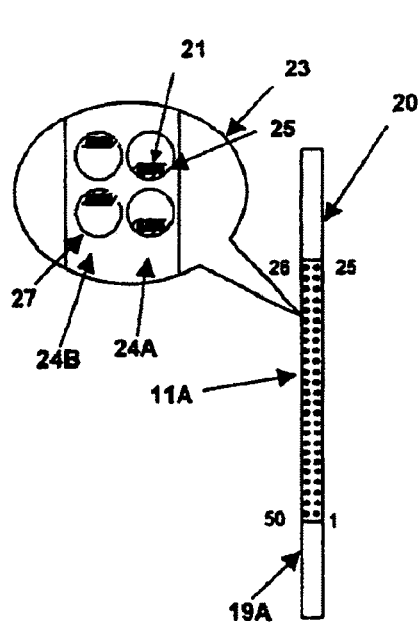
FIG. 2B is a pictorial diagram depicting a side view and FIG. 2C is a pictorial diagram depicting a cross section of a circuit module including a lead-frame carrier in accordance with an embodiment of the invention.

Referring now to the figures and in particular to FIG. 1A, a top view of a prior art circuit module 10 is depicted. A cutaway view 12 is used to show internal details of circuit module 10. Circuit module 10 is depicted as a circuit module as used in various card memory applications, such as Compact Flash (CF).

A carrier 18 to which integrated circuit die 13 is attached and surface mount integrated circuit (IC) 17 and discrete component 16 is mounted, is covered by a cover 19 that is bonded to carrier 18. The circuit module housing may be completely formed from an encapsulant, or the circuit may be encapsulated and a lid applied over the encapsulant. Die 13, discrete component 16 and surface mount IC 17 are coupled to each other and to a connector 11 by circuit pattern 14, which is typically etched from a metal layer on the top of carrier 18. Die 13 is wire-bonded to circuit pattern 14 as shown by wires 15.

Connector 11 is typically soldered to lands of circuit pattern 14, but may be attached with conductive adhesive or conductive tape. Carrier 18, may be a single-sided, double-sided or multi-layer printed wiring board (PWB) or other suitable circuit substrate. Connector 11 is typically a component purchased by the manufacturer of circuit module 10 and typically has features such as annealed and plated connector pins for mechanical and environmental durability. As such, connector 11 contributes greatly to the overall cost of circuit module 10. For applications such as CF, a dual-row 50-pin female connector is required within circuit module 10 for mating with a 50-pin male connector of an external device. The female connector pins are typically pins with a rectangular face with a slot provided through the middle for receiving and retaining the male connector pins of the external device. FIG. 1B depicts a side view of circuit module 10, showing the location of 50-pin female connector 11.

Referring now to FIG. 1C, a cross-section of circuit module assembly 10 is depicted. Die 13 is shown mounted to carrier 18 on which circuit pattern 14 is formed. Surface mount IC 17 is attached to circuit pattern 14 and connector 11 is also attached to circuit pattern 14. Cover 19 encloses the assembly, providing a circuit module form factor in accordance with the CF specifications.

Figure 2A:
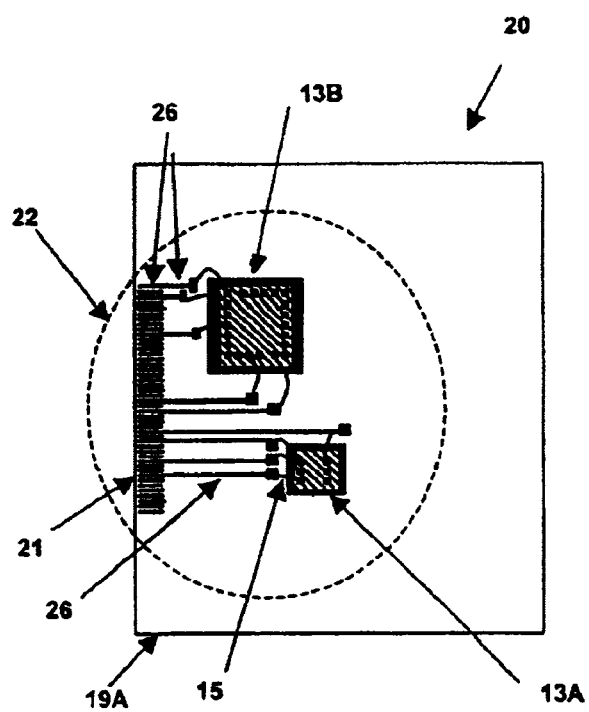
FIG. 2A is a pictorial diagram depicting a top view.

Referring now to FIG. 2A, a circuit module 20, in accordance with an embodiment of the present invention is shown. Circuit module 20 is depicted as a circuit module as used in various card memory applications, such as Compact Flash (CF). The present invention is also applicable to cards and modules having other outlines such as personal computer memory cards and peripheral device cards (I/O cards), as well.

A cutaway view 22 is used to show internal details of circuit module 20. A lead-frame carrier 26, having integral connector pins 21 formed at an end thereof, is included within circuit module 20 to interconnect dies 13A and 13B and an external device via connector pins 21. An encapsulation 19A surrounds the internal components of circuit module 20, and further provides the housing for connector pins 21. Details of lead-frame based circuit modules without integral connector pins are described in the above-incorporated patent application "LEAD-FRAME METHOD AND ASSEMBLY FOR INTERCONNECTING CIRCUITS WITHIN A CIRCUIT MODULE."

The present invention eliminates the cost of a discrete connector component from the cost of circuit module 20 assembly. The reliability of the circuit module may also be improved by the elimination of the interconnection between a discrete connector and the carrier. Furthermore, the size of the discrete connector shell is no longer a factor in the design of the circuit module housing, as the circuit module housing forms the connector shell in accordance with embodiments of the present invention.

Referring now to FIG. 2B, a side view of circuit module 20 is depicted, showing the location of a 50-pin female connector 11A formed by encapsulation 19A and connector pins 21. Callout 23 shows details of the connector pin 12 arrangement. Connector pins 21 are divided into a first set 24A and a second set 24B of connector pins 21, forming a first and second row of female connector 11A. Every other connector pin 21 of lead-frame 26 is bent out of the plane of lead-frame 24A, thereby providing an extension forming a second row (second set 24B) of connector contacts.

In order to simplify the manufacture of connector 11A, a novel pin arrangement is used. Connector pins 21 in the first set 24A are arranged at one side of recesses 27 formed in encapsulation 19A, and connector pins 21 in the second set 24B are arranged at the opposite side of recesses 27. Male connector pins of an external device contact connector pins 21 by sliding contact with the face of connector pins 21. Connector pins 21 are further tapered to provide positive mating as connector 11A is inserted in an external device socket. Encapsulant 19A over-molds connector pins 21 by approximately 90% of the thickness of connector pins 21, providing an over-mold 25, that secures connector pins 21 within recesses 27. Thus, hardening of connector pins 21 is not required to provide a reliable connector 11A. Lead-frame 26 is also plated during fabrication with Nickel-Palladium plating. Therefore selective plating of connector pins 21 is not necessary to protect connector pins 21 from the external environment, but may be performed to increase reliability or improve electrical contact. Selective silver or gold plating may therefore be applied to connector pins 21.

Figure 2C:
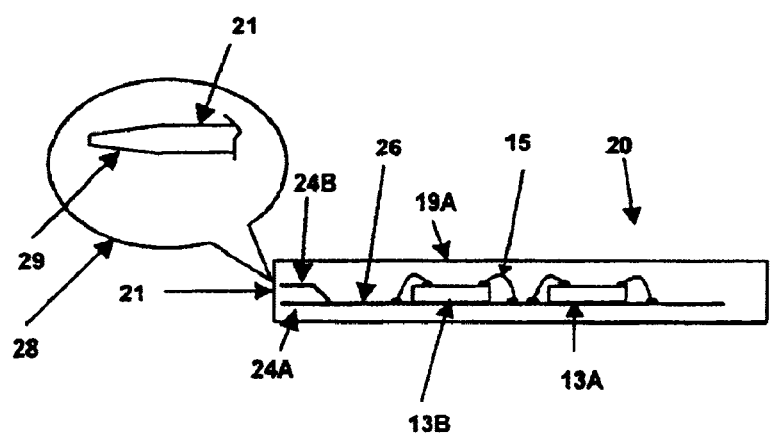

Referring now to FIG. 2C, a cross section view of circuit module 20 is depicted in accordance with an embodiment of the invention. Dies 13A and 13B are connected to lead-frame carrier 26 by wires 15 bonded to lands on dies 13A, 13B and lead-frame carrier 26. Encapsulant 19A covers dies 13A, 13B and lead frame carrier 26 (except the connector pin 21 portion within recesses 27). Callout 28 depicts the tapered shape of connector pins 21. A tapered face 29 is cut or stamped on connector pins 21, and lead-frame 26 is generally pre-fabricated with the tapered shape. Second row 24B of connector pins 21 is shown bent upward from the plane of lead frame 26. Second row 24 is bent prior to assembly. Connector pins 21 are stamped or cut to protrude past a dam bar, providing a lead-frame in which connector pins 21 may be bent into multiple rows prior to singulation of the dam bar.

Figure 3:
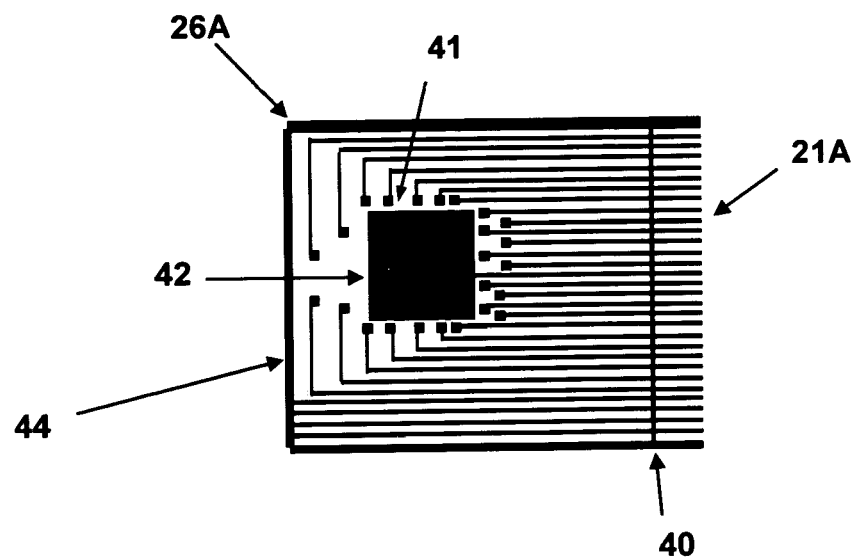
FIG. 3 is a pictorial diagram depicting a top view of a lead-frame carrier in accordance with an embodiment of the invention.

Referring now to FIG. 3, a top view of a lead-frame 26A in accordance with an embodiment of the invention is depicted. Leads 43, terminating in connector pins 21A, are supported by a dam bar 44 that surrounds the periphery of the lead-frame on three sides providing rigidity during the fabrication and integration processes (A fourth dam bar 44 side may be provided at the location of connector pins 21A but must be removed prior to bending pins if the connector implementation is multi-row). Lead-frame 26A is generally stamped from a metal, such as copper, and an integrated circuit die is bonded to lead-frame in die bonding area 41. Wire bonding pads 41 are provided on leads 43 to permit attachment of wires from a die to the lead-frame. Connector pins 21A are bent, as described above, for implementation of a multi-row connector.

Lead-frame 26A is then encapsulated (except for the recesses containing connector pins 21A and portions of dam bar 44 are cut, resulting in electrical isolation of leads 43, after mechanical rigidity has been provided by the encapsulant. Alternatively, the circuit mounting portion of lead frame 26A may be molded separately, prior to or after encapsulating connector pins 21A. In addition or in alternative to wire bonding pads 43, pads may be included for attachment of surface mounted passive components by soldering or conductive adhesive attachment, and pad grids may be included for attachment of pre-packaged integrated circuits.

The illustrative embodiments herein depict an etched or stamped lead-frame. The embodiment depicted in the above illustrations, wherein connector pins are bent to provide dual contact rows especially lends itself to stamping, because leads 43 and connector pins 21A may be formed and bent in a single stamping operation.

Figure 4:
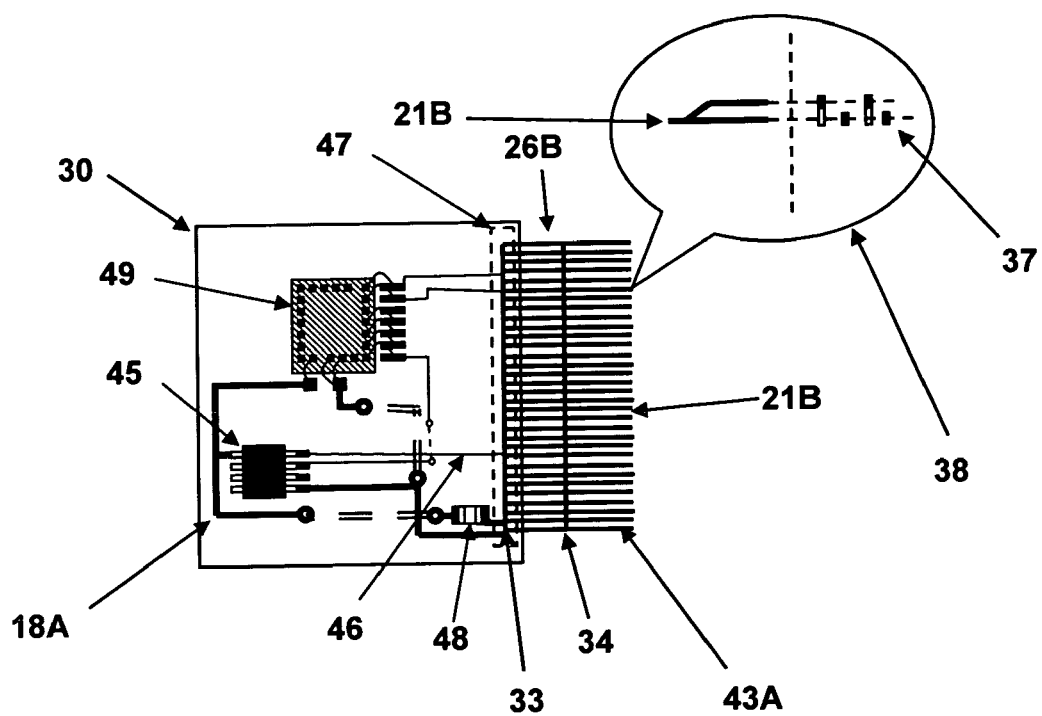
FIG. 4 is a pictorial diagram depicting a top view of circuit module assembly in accordance with an alternative embodiment of the invention.

Referring now to FIG. 4, a top view of a circuit module assembly 30, in accordance with an alternative embodiment of the invention is depicted. The depiction shows the internal features of a circuit module after a carrier 18A has been bonded to a lead-frame 26B. Carrier 18A may have various integrated circuit dies 49, surface mount discrete components 48 and surface mount integrated circuits 45 mounted thereon and is generally a PWB-type substrate having a circuit patterns 46 for interconnection of the various mounted components.

A lead-frame 26B, including connector pins 21B, but no circuit mounting area (hence lead-frame and not lead-frame carrier), is electrically and mechanically coupled to carrier 18A by solder, conductive tape 47 or epoxy, wire bonding (with wire bonding areas supplied on both lead-frame 26B and carrier 18A), or an alternative coupling scheme. Mechanical gluing may be used frame 26B includes a dam bar 34 for support of leads 43A, prior to singulation of connector pins 21B. The ends 31 of connector pins 21B may be pre-bent, permitting first gluing and electrical attachment of lead-frame 26B to carrier 18A, then singulating connector pins 21B by sawing dam bar 34, and finally encapsulating the entire circuit module assembly 30 (except for the recesses containing connector pins 21B). Callout 38 depicts details of connector pins 21B, showing the staggered arrangement 37 of connector pins 21B after bending.

The above-described embodiment of the invention provides the low cost associated with the lead-frame connector of the present invention, but with a standard PWB carrier that may more readily provide mounting for discrete components and reduce circuit area using multiple layers of printed circuits within the carrier.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A circuit module, comprising:
    at least one integrated circuit for providing an electronic function of the circuit module;
    a lead-frame carrier for providing electrical connection to the at least one integrated circuit within the circuit module, the lead-frame carrier including leads having connector pins formed at an end thereof for providing an electrical interface to the at least one integrated circuit; and
    an encapsulation containing the at least one integrated circuit and the lead-frame carrier on both a top and a bottom side, wherein the connector pins are each recessed within a corresponding one of a plurality of recesses terminating on a single side of an outline volume defined by the exterior surfaces of the encapsulation so that the connector pins do not protrude beyond the outline volume and are isolated from each other by walls of the encapsulation between adjacent ones of the recesses, and wherein the connector pins provide a detachable connection to interface the circuit module to an external connector of opposite gender.

2. The circuit module of claim 1, wherein the at least one integrated circuit is mounted on the lead-frame carrier and electrically connected to the lead-frame carrier for providing the electrical interface to the connector pins.

3. The circuit module of claim 1, further comprising a substrate for mounting a first one of the at least one integrated circuit within the circuit module, and wherein circuit patterns on the substrate are connected to electrical connections from the at least one integrated circuit and further connected to the lead-frame carrier.

4. The circuit module of claim 3, wherein a second one of the at least one integrated circuit is mounted on the lead-frame carrier and electrically connected thereto.

5. The circuit module of claim 4, wherein the second integrated circuit is a semiconductor die, wherein the semiconductor die is wire-bonded to the lead-frame carrier, the second integrated circuit is an integrated circuit within a surface mount package having pre-formed leads, and wherein the pre-formed leads are attached to the circuit patterns on the substrate.

6. The circuit module of claim 3, wherein the circuit patterns on the substrate are connected to the lead-frame carrier by a plurality of wires bonded at one end to the lead-frame carrier and at a second end to bond pads on the substrate.

7. The circuit module of claim 3, wherein the circuit patterns on the substrate are connected to the lead-frame carrier by a conductive attachment between the lead-frame carrier and circuit patterns on the substrate.

8. The circuit module of claim 1, wherein the connector pins are located to one side of the corresponding recess for permitting a wall defining the recess to over-mold a portion of the connector pin, whereby the connector pins are mechanically secured by the over-mold.

9. The circuit module of claim 1, wherein the connector pins are tapered to provide a mating surface for male connector pins of an external device.

10. The circuit module of claim 1, wherein the lead-frame carrier comprises an extension extending from the plane of the lead-frame carrier, the connector pins form a first set of connector pins, and wherein a second set of connector pins is formed on the extension in a plane substantially parallel to the original set of connector pins, whereby a multi-row pin connector is provided within the circuit module.

11. The circuit module of claim 10, wherein the encapsulation forms a female connector housing wherein each of the first set of connector pins are located to one side of the corresponding recess and each of the second set of connector pins are located to an opposite side of the corresponding recess.

12. The circuit module of claim 10, wherein the connector pins are located to one side of the corresponding recess for permitting the second set of connector pins to extend above the first set of connector pins without contacting the first set of connector pins.

13. The circuit module of claim 12, wherein a wall defining the recess over-molds a portion of the first and second set of connector pins, whereby the first and second set of connector pins are mechanically secured by the over-mold.

14. The circuit module of claim 1, wherein the circuit module is a compact flash memory card.

15. The circuit module of claim 1, wherein the encapsulation forms a male connector for providing the detachable connection, and wherein the connector pins are coaxially located within the corresponding recesses.

16. A circuit module, comprising:
    at least one integrated circuit for providing an electronic function of the circuit module;
    a lead-frame carrier for providing a detachable electrical connection to the at least one integrated circuit within the circuit module from an external device, the lead-frame carrier including means for providing an electrical interface from the at least one integrated circuit to an external device; and
    an encapsulation containing the at least one integrated circuit and the lead-frame carrier on both a top and a bottom side, wherein the electrical interface means are recessed within corresponding receptacles terminating on a single side of an outline volume defined by the exterior surfaces of the encapsulation so that the lead-frame carrier does not protrude beyond the outline volume.

17. The circuit module of claim 16, wherein the encapsulation forms a male connector for providing the detachable connection, and wherein the connector pins are coaxially located within the corresponding recesses.

18. An electrical connector for connecting a circuit module to an external device, comprising:
   a lead-frame having connector pins formed at ends of leads thereof;
   a connector shell formed by an encapsulation over the lead-frame, wherein the connector pins are recessed within corresponding receptacles terminating on a single side of an outline volume defined by the exterior surfaces of the encapsulation so that the lead-frame carrier does not protrude beyond the outline volume.

19. The electrical connector of claim 18, wherein the encapsulation forms a female connector housing defining pin recesses on the side of the circuit module, wherein the connector pins are located to one side of the corresponding recess for permitting a wall defining the recess to over-mold a portion of the connector pin, whereby the connector pins are mechanically secured by the over-mold.

20. The electrical connector of claim 18, wherein the lead-frame comprises an extension extending from the plane of the lead-frame, the connector pins form a first set of connector pins, and wherein a second set of connector pins is formed on the extension in a plane substantially parallel to the original set of connector pins, whereby a multi-row pin connector is provided thereby.

21. The electrical connector of claim 20, wherein the encapsulation forms a female connector housing, and wherein each of the first set of connector pins are located to one side of the corresponding recess and each of the second set of connector pins are located to an opposite side of the corresponding recess.

22. The electrical connector of claim 18, wherein the encapsulation forms a male connector housing for providing the detachable connection, and wherein the connector pins are coaxially located within the corresponding recesses.

* * * * *